(12) United States Patent
Seno

(10) Patent No.: US 8,759,987 B2
(45) Date of Patent: Jun. 24, 2014

(54) SEMICONDUCTOR DEVICE AND METHOD OF MANUFACTURING THE SEMICONDUCTOR DEVICE

(75) Inventor: Ryota Seno, Tokushima (JP)

(73) Assignee: Nichia Corporation, Anan-shi (JP)

( * ) Notice: Subject to any disclaimer, the term of this patent is extended or adjusted under 35 U.S.C. 154(b) by 13 days.

(21) Appl. No.: 13/500,849

(22) PCT Filed: Oct. 7, 2010

(86) PCT No.: PCT/JP2010/067642
§ 371 (c)(1),
(2), (4) Date: Apr. 6, 2012

(87) PCT Pub. No.: WO2011/043417
PCT Pub. Date: Apr. 14, 2011

(65) Prior Publication Data
US 2012/0193791 A1    Aug. 2, 2012

(30) Foreign Application Priority Data
Oct. 9, 2009   (JP) .............................. P 2009-235305

(51) Int. Cl.
| H01L 23/48 | (2006.01) |
| H01L 23/52 | (2006.01) |
| H01L 29/40 | (2006.01) |
| H01L 21/44 | (2006.01) |
| B23K 31/00 | (2006.01) |
| B23K 31/02 | (2006.01) |

(52) U.S. Cl.
USPC ......... 257/780; 257/784; 438/617; 228/180.5

(58) Field of Classification Search
USPC ............... 257/780, 784; 438/617; 228/180.22
See application file for complete search history.

(56) References Cited

U.S. PATENT DOCUMENTS

| 6,215,182 | B1 * | 4/2001 | Ozawa et al. ................. 257/723 |
| 6,602,778 | B2 * | 8/2003 | Manning et al. .............. 438/617 |
| 6,787,926 | B2 | 9/2004 | Chen et al. |
| 6,815,836 | B2 | 11/2004 | Ano |
| 6,921,016 | B2 * | 7/2005 | Takahashi .................. 228/180.5 |
| 6,933,608 | B2 | 8/2005 | Fujisawa |
| 7,934,634 | B2 * | 5/2011 | Mii et al. .................... 228/180.5 |

(Continued)

FOREIGN PATENT DOCUMENTS

| JP | 2002-353267 A | 12/2002 |
| JP | 2003-243442 A | 8/2003 |

(Continued)

*Primary Examiner* — David Zarneke
(74) *Attorney, Agent, or Firm* — Birch, Stewart, Kolasch & Birch, LLP

(57) ABSTRACT

Disclosed are: a semiconductor device that comprises a semiconductor element to which a plurality of wires are bonded, wherein bonding strength of the wires is high and sufficient bonding reliability is achieved; and a method for manufacturing the semiconductor device. Specifically disclosed is a semiconductor device which is characterized by comprising a first wire that has one end bonded onto an electrode and the other end bonded to a second bonding point that is out of the electrode, and a second wire that has one end bonded onto the first wire on the electrode and the other end bonded to a third bonding point that is out of the electrode. The semiconductor device is also characterized in that the bonded portion of the first-mentioned end of the second wire covers at least apart of the upper surface and the lateral surface of the first wire.

18 Claims, 8 Drawing Sheets

(56) References Cited

U.S. PATENT DOCUMENTS

| | | | |
|---|---|---|---|
| 8,008,785 B2* | 8/2011 | Haba et al. | 257/784 |
| 2002/0089070 A1* | 7/2002 | Manning et al. | 257/784 |
| 2003/0155660 A1 | 8/2003 | Takahashi et al. | |
| 2004/0104477 A1 | 6/2004 | Fujisawa | |
| 2004/0191954 A1* | 9/2004 | Ano | 438/106 |
| 2006/0189117 A1 | 8/2006 | Takahashi et al. | |
| 2008/0116591 A1 | 5/2008 | Hayashi et al. | |
| 2009/0321927 A1* | 12/2009 | Nishimura et al. | 257/737 |
| 2010/0237480 A1* | 9/2010 | Mii et al. | 257/676 |
| 2010/0248470 A1* | 9/2010 | Mii et al. | 438/617 |
| 2010/0276802 A1* | 11/2010 | Shirahama | 257/738 |
| 2010/0327450 A1* | 12/2010 | Uno et al. | 257/762 |
| 2011/0285020 A1* | 11/2011 | Haba et al. | 257/741 |

FOREIGN PATENT DOCUMENTS

| | | |
|---|---|---|
| JP | 2004-172477 A | 6/2004 |
| JP | 2004-289153 A | 10/2004 |
| JP | 2008-130863 A | 6/2008 |
| JP | 2009-76783 A | 4/2009 |
| WO | WO 2009/037878 A1 | 3/2009 |

* cited by examiner

SEMICONDUCTOR DEVICE AND METHOD OF MANUFACTURING THE SEMICONDUCTOR DEVICE

BACKGROUND OF THE INVENTION

1. Technical Field

The present invention relates to a semiconductor device and a method of manufacturing the semiconductor device, and more particularly relates to a semiconductor device having a semiconductor element where wire bonding is applied within it or between it and other semiconductor elements, and also relates to a method of manufacturing the semiconductor device.

2. Description of Background Art

Conventionally, there have been semiconductor devices using a semiconductor element in which a plurality of semiconductor elements are mounted in a single package, and methods of connecting such a plurality of semiconductor elements by way of wire bonding (for example in Patent Reference 1) have been proposed. According to such a method, when a plurality of semiconductor light emitting elements are connected by wires (wire bonding), firstly, as a first wire, a wire is wedge bonded to an upper electrode of a semiconductor light emitting element from at a terminal of an electrode pattern. Next, a second wire is placed on the wedge-bonded portion and then ball bonded onto the wedge-bonded portion. With this, the ball formed by the ball bonding is connected onto the upper electrode of the semiconductor light emitting element, so that the wire is prevented from becoming a thin film at this portion and thus achieves enhancement of the joining of the wire bonding.

Also proposed is a method in which the ball neck formed by ball bonding of the first wire is pressed to crush by the tip of the capillary, aside surface of the first wire which is folded back thereon is pressed against the ball neck, and the second wire is further bonded thereon (for example, Patent Reference 2). According to this method, at the time of bonding the second wire, the impact of the bonding is eased by deforming the wire which is pressed against the ball neck. With this, damage to the semiconductor is reduced. In addition, at the time of bonding the second wire, using the pressure of the capillary, the first wire is deformed into a protrusion which enters the center bore of the capillary, and the second wire is interposed and pressed between the protrusion which is entered in the center bore of the capillary and the inner chamfer portion of the capillary.

Patent Reference 1: JP 2002-353267A
Patent Reference 2: JP 2009-76783A

DISCLOSURE OF INVENTION

Problems to be Solved by the Invention

However, the method described in Patent Document 1 has a problem that when wedge bonding is performed directly on the electrode of a semiconductor element, stable joining cannot be obtained due to the thinned thickness of the electrode. This is because in the case where the electrode has a small thickness, the semiconductor may be damaged by a stress applied at the time of bonding. Further, in the case where a semiconductor element is of a type having both the positive and negative electrodes on one side of the semiconductor layer, the height of the surface of one of the electrodes is lower than the height of the surface of the light emitting element. Therefore, when the wedge bonding is performed onto the surface of one of the electrodes, a trouble may arise in which the surface of the step difference of the semiconductor element is damaged by the tip portion of the capillary. Also, in the method described in Patent Document 1, ball bonding is performed onto the wedge-bonded portion. Accordingly, the distance between the wedge-bonded portion of the wire and the surface of the semiconductor element becomes small, and at between the wedge-bonded portion and the semiconductor element, there arises a problem of decrease in heat dissipation efficiency in the adjacent members etc. In the method described in Patent Document 2, because the center of the capillary is the portion from where the wire material is supplied, at the time of bonding the second wire, it cannot be pressed by the center of the capillary. As a result, the second wire is joined over the periphery of the ball neck, so that good joining state may not be able to be secured. Also, the first wire at the periphery of the projected portion is pressed between the face portion of the capillary and the ball portion and becomes thin, which poses a problem that the wire tends to break at this portion. Accordingly an object of the present invention is to provide a semiconductor device which has a semiconductor element having a plurality of wires bonded thereto, and is able to realize sufficient joining reliability, and a method of manufacturing the semiconductor device.

Means to Solve the Problems

In accordance with an aspect of the present invention, a semiconductor device includes a first wire having one end bonded to an electrode and another end bonded to a second bonding point at a portion other than the electrode, and a second wire having one end bonded on the first wire over the electrode and another end bonded to a third portion which is a portion different than the electrode, and a bonding portion at the one end of the second wire covers at least a part of the upper surface and a side surface of the first wire. According to the construction described above, regardless of the location of the electrodes of the semiconductor element, a sufficient wire joining area can be secured while reducing the number and the length of the wires, the joining strength of the wires can be enhanced.

Moreover, it is preferable that the first wire has one end which forms a ball portion bonded on the electrode, and a folded-back portion in which the first wire is extended from the ball portion in a direction different to the second bonding point and then folded back on the ball portion, and that the second wire has one end bonded on the folded back portion and covers at least a part of a side surface at the opposite side of the second bonding point of the folded back portion. With the construction as described above, the joining strength of the wires can be further enhanced.

It is preferable that the folded-back portion has a lower portion pulled over the ball portion in the opposite direction than the extending direction of the wire and an upper portion in which the wire extended from the lower portion is folded back on the ball portion, and that the tip of the second wire covers at least a part of the lower portion of the folded-back portion at the opposite side than the extending direction of the second wire. With the construction as described above, the bonding strength of the wires can be further enhanced. It is preferable that the tip of the second wire covers at least the ball portion. It is preferable that the tip of the second wire covers at least the ball portion. With the construction as described above, the joining strength of the wires can be enhanced. It is preferable that the second wire is arranged approximately horizontally over the folded-back portion at the extending direction side of the second wire. With this arrangement, stress loaded on the wire can be reduced, so that disconnection or the like of the wire can be prevented.

In accordance with an aspect of the present invention, a method of manufacturing a semiconductor device includes a first step of bonding a first wire on an electrode and forming a ball portion, forming a folded-back portion on the ball portion, and extending the first wire from the folded-back portion in a predetermined direction, a second step of bonding a second wire on the folded-back portion. In the second step, external force is applied and press the second wire at an opposite side than the extending direction of the second wire rather than at the center of the folded-back portion (shown with a dashed line in FIG. 4(c)) and joined to the folded-back portion. With such an arrangement, sufficient joining area of the wires can be secured, so that sufficient joining reliability of the wires can be obtained. It is preferable that the folded-back portion has a lower portion which is pulled from over the ball portion in a direction opposite to the extending direction of the wire, and an upper portion where the wire extended from the lower portion is folded back into the ball portion, and that the squashed portion of the second wire is joined at least to a lower portion of the folded-back portion at the opposite side with respect to the extending direction of the second wire. With such an arrangement, sufficient joining area of the wires can be secured, so that the joining strength of the wires can be enhanced. It is preferable that the folded-back portion has a lower portion pulled over the ball portion in the opposite direction than the extending direction of the wire and an upper portion in which the wire extended from the lower portion is folded back on the ball portion, and that the tip of the second wire covers at least a part of the lower portion of the folded-back portion at the opposite side than the extending direction of the second wire. With the construction as described above, the bonding strength of the wires can be enhanced. It is preferable that the pressed portion of the second wire is bonded at least to the ball portion. With the construction as described above, the bonding strength of the wires can be enhanced. It is preferable that the second wire is arranged approximately horizontally over the folded-back portion at the extending direction side of the second wire. With this arrangement, stress loaded on the wire can be reduced, so that disconnection or the like of the wire can be prevented.

In accordance with an aspect of the present invention, a method of manufacturing a semiconductor device includes a first step of ball bonding a first wire on an electrode, and a second step of bonding a second wire on a ball portion of the first wire, and in the second step, the second wire is bonded to cover the center (shown in a dashed line in FIG. 4(c)) of the ball portion of the first wire. With the construction as described above, sufficient bonding strength of the wires can be secured.

Effect of the Invention

According to the present invention there is provided a semiconductor device including a semiconductor element having a plurality of wires bonded thereto, in which, regardless of the location of the electrodes, the number and the length of the wires is reduced while attaining high bonding strength of the wires and realizing sufficient bonding reliability, and there is also provided is a method of manufacturing the semiconductor device.

DETAILED DESCRIPTION OF THE PREFERRED EMBODIMENTS

Preferred embodiments (hereinafter referred to as embodiments) of the present invention will be described in detail below with reference to accompanying drawings. However, the present invention is not limited to the embodiments disclosed below.

Figure 1:
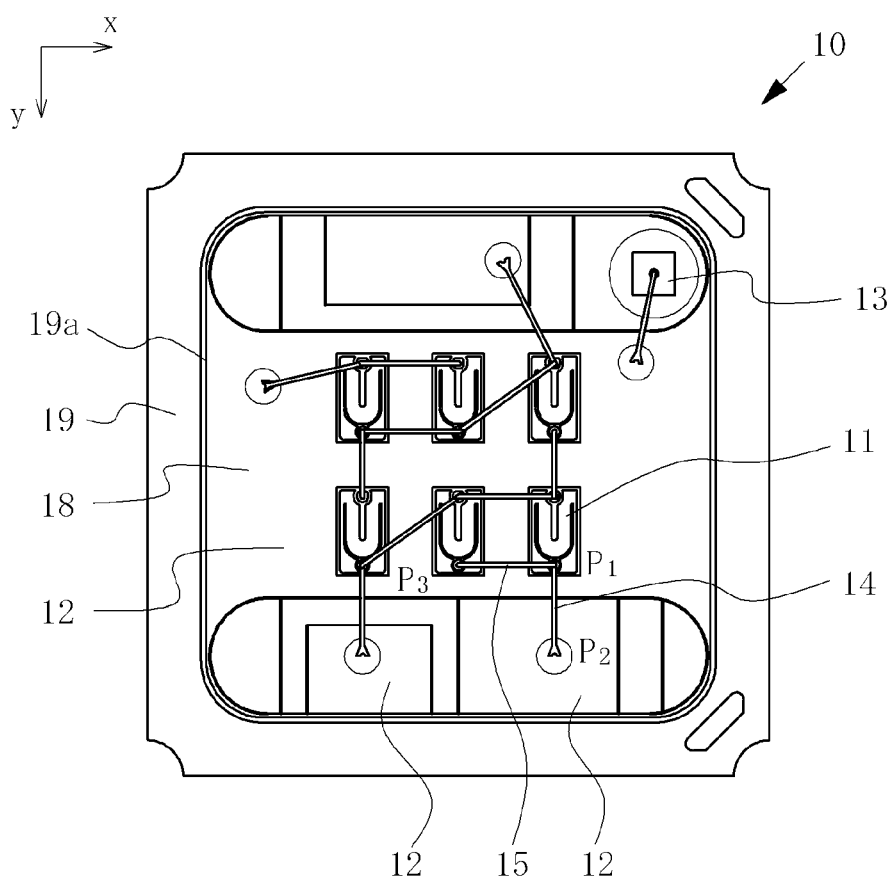
FIG. 1 is a schematic cross-sectional view showing a semiconductor device according to an embodiment of the present invention.
Figure 2:
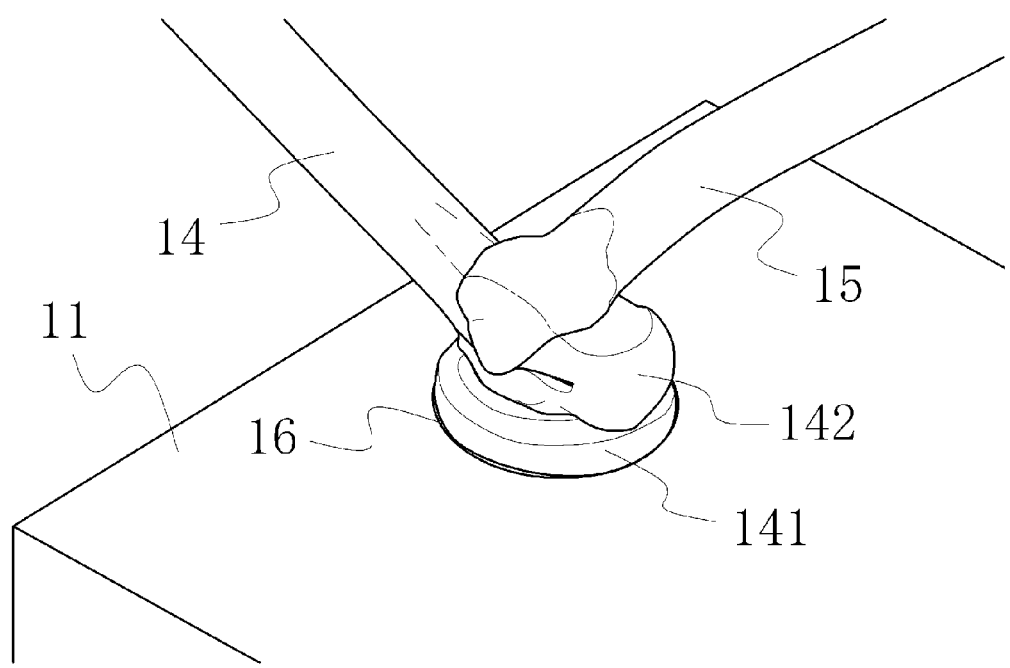
FIG. 2 is a schematic perspective view showing a wire-bonded portion of a semiconductor device according to an embodiment of the present invention.
Figure 5:
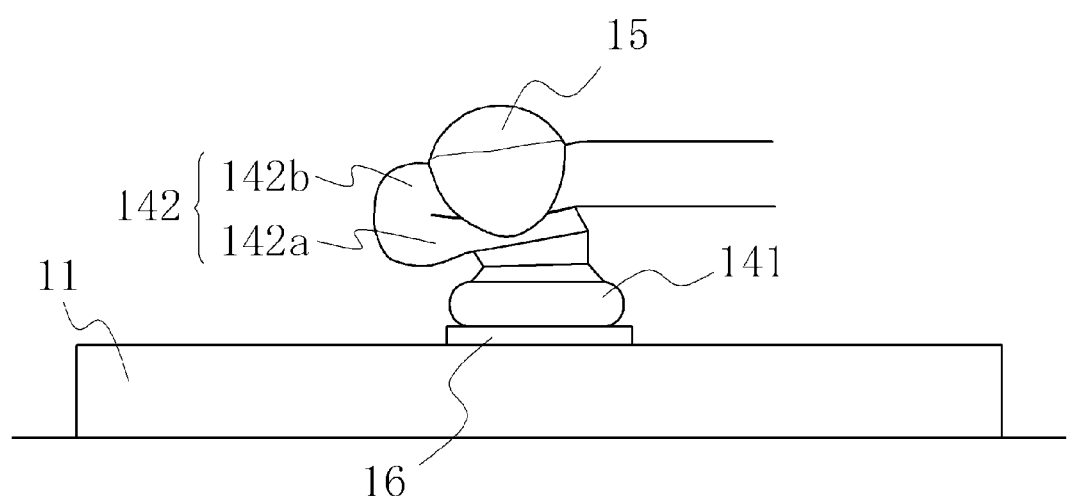
FIG. 5 is a schematic side view illustrating wire bonding of a semiconductor device according to an embodiment of the present invention.

FIG. 1 is a schematic cross-sectional view showing a semiconductor device 10 according to an embodiment of the present invention. FIG. 2 is a schematic perspective view showing a wire-bonded portion of a semiconductor device 10 according to an embodiment of the present invention. FIG. 5 is a schematic side view illustrating wire bonding of a semiconductor device 10 according to an embodiment of the present invention.

A semiconductor device 10 according to the present embodiment is constituted by at least a semiconductor element 11 and a wire. Generally, a wire connects semiconductor elements 11 with each other or a metal member 12 with a semiconductor element 11. A wire includes at least a first wire 14 and a second wire 15. The first wire has a ball portion 141 ball-bonded on an electrode 16 of the semiconductor element 11 and a folded-back portion 142 formed on the ball portion 141, and is further extended from the folded-back portion 142 in a predetermined direction. The second wire 15 is bonded on the folded-back portion of the first wire. The tip of the second wire covers a part of the folded-back portion at the opposite side from the extending of the second wire (at least a part of a side surface of the folded-back portion 142 of the first wire 14 which is at the opposite side from the extending of the second wire 15 is covered with the tip of the second wire 15). With this, good bonding state of the wires can be maintained. The tip of the second wire preferably covers at least the ball portion (at least a part of the ball portion 141). According to this arrangement, the bonding strength of the wires can be enhanced. In the semiconductor device of the present embodiment, a semiconductor element, a metal member and the like are formed or sealed by a resin, preferably integrally. The mold resin may be made of any materials as long as insulation with respect to the semiconductor element or the like can be secured. Such a seal resin may be made of any material as long as the material is capable of ensuring the insulation of the semiconductor element or the like and has a light transmissive property. Size and shape of the mold or seal resin is not specifically limited.

Hereinafter, each constructional member will be described in detail below.

(Semiconductor Element)

The semiconductor element used in the present invention is not specifically limited as long as the element is formed of a stacked layer of semiconductors and is capable of being wire-bonded on an electrode. The semiconductor elements used in the present invention may be of a type in which positive and negative electrodes are respectively formed on the opposite sides (for example, on the upper surface and the lower surface) of the semiconductor layer, or the positive and negative electrodes are formed on the same surface side of the semiconductor layer. The pair of electrodes in the latter case generally have a difference in the heights, but may be arranged at the same height (approximately the same distance from the semiconductor layer) by adjusting the height of the bumps or the like. In the case of having a difference in the heights, wedge-bonding directly on the electrode may results in an inferior joining status because the joining areas between the wires and the electrodes obtained by the wedge-bonding are smaller than the joining areas between the ball portions and the electrodes obtained by ball bonding, and may lead damages caused by the capillary contacting the dice. In this case, the number of the positive and negative electrodes formed is not limited to one and two or more of each may be formed.

The electrode 16 is not specifically limited in terms of the material, the thickness, and the structure, but according to the kinds of wire, either a single layer structure or a stacked layer structure containing gold, copper, lead, aluminum, or an alloy of these may be used. The thickness of the electrode is not specifically limited, but it is preferable that Au is disposed as the final layer (the outermost side) with the thickness of about 100 nm or more. A wire will be bonded to the final layer of the electrode, that is, to the outermost layer.

In the semiconductor devices, either a single or a plurality of semiconductor elements may be mounted on a single semiconductor device. In the case where a plurality of semiconductor elements are mounted, the type of connection is not specifically limited and they may be connected in parallel, in series, or in a combination thereof.

(Metal Member)

A metal member serves as a substrate for mounting a semiconductor element and an electrode to be electrically connected with a semiconductor element, and is sufficient to have a substantially planar shape, and may have a corrugated plate shape or a plate shape with irregular surface contour. The thickness of the metal member may be substantially uniform in whole, or may be thick or thin in part. The material of the metal member is not specifically limited, but it is preferably made of a material having a relatively large thermal conductivity (for example, about 200 W/(m·K) or larger), a material having a relatively high mechanical strength, or a material capable of facilitating operations in punching-pressing or etching. Forming with such a material allows the heat generated by the semiconductor element to be dissipated more efficiently. Examples thereof include a metal such as copper, aluminum, gold, silver, tungsten, iron, and nickel and an alloy such as iron-nickel alloy and phosphor bronze. Also, reflective plating is preferably applied to the surface of the metal member so that light from the semiconductor element can be extracted efficiently.

Generally, two or more metal members are provided to a single semiconductor device. One metal member more than the number of the semiconductor element may be provided. The metal member may have, in addition to a region to which a semiconductor element is mounted and connected, an extended region as a lead terminal for connecting with an external component. The lead terminal can be appropriately bent or deformed or the shape thereof can be altered according to the mounting type (for example, side view type in which the light emitting surface is perpendicular to the mounting surface of the read terminal, top view type in which the light emitting surface is in parallel to the mounting surface of the lead terminal, or the like) and to the application type of the semiconductor device of the present invention.

In the semiconductor device, the semiconductor element and the metal member are preferably arranged so that the angle between the extending direction of the first wire and the extending direction of the second wire is in a range of 45 degrees to 135 degrees. With this arrangement, the second wire is securely joined with the upper surface and a side surface of the folded-back portion of the first wire, that is, with two surfaces, so that the joining strength can be significantly increased.

(Wire)

A wire is an electrically conductive member that is used to electrically connect (i.e., bond) between a metal member and an electrode formed on the surface of a semiconductor element, between the semiconductor elements, between the electrodes in a semiconductor element, or the like.

In the present invention, in a wire between two points, a point bonded as a starting point may be referred to a first bonding point, and a point bonded as an ending point may be referred to as a second bonding point. At the first bonding point, a ball formed by melting the wire is bonded on the electrode of the semiconductor element. The connection portion of the wire which is ball-bonded as described above may be referred to as a ball portion. The ball may have a spherical shape, a near-spherical shape, or a oval shape. Further, the ball portion includes a form which is made by after forming in such a shape described above, the shape is altered the pressure applied at the time of connecting the second wire to the upper portion. At the second bonding point, the wire is connected without through a ball. The portion in the second bonding point where the wire is connected may be referred to as a wedge bonded portion 144. The second bonding point (or wedge-bonded portion) is preferably arranged on the metal member so as to be in contact with the metal member. In a case where the second bonding point is arranged over an electrode of a semiconductor element, it is preferable that the second bonding point is arranged at least through the ball portion so that the wedge-bonded portion is not connected to the electrode of the semiconductor element.

"A bonding point" refers generally to a region in a surface of an electrode of a semiconductor element or a surface of a metal member constituting a semiconductor device, but in a case where a plurality of wires are provided (for example, another wire is bonded on a bonded wire), it also refers to a region which is bonded, for example, a region over the wire or the ball portion.

In the present invention, a wire includes at least a first wire and a second wire. A first wire indicates a wire which connects the first bonding point and the second bonding point. A second wire indicates a wire which connects a third bonding point arranged at a location which is not on the straight line passing through the two points, the first bonding point and the second bonding point, and a part on the ball portion of the first wire. A plurality of wires corresponding to the first and second wires as described above may be provided in one semiconductor device.

Figure 9:
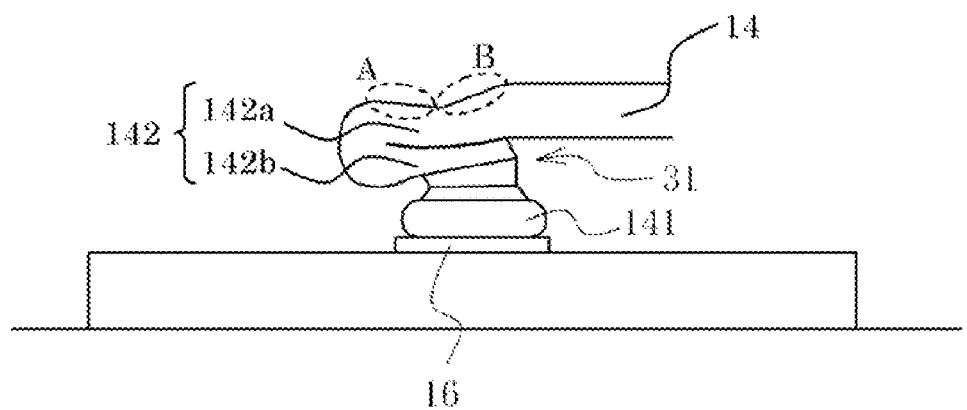
FIG. 9 is a cross-sectional view showing a detail of a folded-back portion.

The first wire 14 has, as described above, a ball portion 141 which is ball-bonded on an electrode of a semiconductor element, and a folded-back portion 142 on the ball portion. FIG. 9 is a cross-sectional view showing a detail of the folded-back portion 142. In FIG. 9, the description of the second wire 15 is omitted for easy understanding of the detail of the folded-back portion 142. The diameter of the ball portion 141 is appropriately adjusted according to the size of the semiconductor device and the electrodes mounted thereto, and for example, is about 50 μm to about 100 μm. The folded-back portion 142 is formed by, from on the ball portion 141, pulling a wire in a direction opposite to the extending direction of the wire (a direction to a point which is the end point of the wire, that is, a direction to the second bonding point), and further folding back in a direction to the point which becomes the end point of the wire, and the folded wire is pressed on the ball portion 141. Here, in the folded-back portion 142, the portion pulled from on the ball portion 141 to the direction opposite to the extending direction of the wire is indicated as the lower portion 142a of the folded-back portion and the portion where the wire extended from the lower portion 142a of the folded-back portion is folded back on the ball portion 141 is indicated as the upper portion 142b of the folded-back portion. That is, on the lower portion 142a of the folded-back portion, the upper portion 142b of the folded-back portion is arranged in contact with (joined) the lower portion 142a of the folded-back portion. The upper portion 142b of the folded-back portion preferably has a flat portion in its upper surface. In the embodiment shown in FIG. 9, it has two flat portions respectively shown in the ellipse A and the ellipse B. Each flat portion has an angle of 30° or less with respect to the surface of the electrode 16 on which the ball portion 141 is formed. For example, the flat portion shown in the ellipse A has an angle of about 5° and the angle shown in the ellipse B has an angle of about 20 to 30°. Either of the directions of tilt of the flat portions (rising to the right or rising to the left in FIG. 9) may be taken. The folded-back portion 142 is preferably protruded from over the ball portion 141 in an opposite direction (opposite direction with respect to the second bonding point) to the extending direction of the wire. That is, the length of the folded-back portion 142 in a horizontal direction is preferably longer than the radius of the ball portion 141. With this arrangement, the bonding strength of the second wire bonded on the folded-back portion 142 can be increased. The folded-back portion 142 preferably has a length of about 30 μm to 100 μm from the center of the ball portion in a direction opposite to the extending direction of the wire. From the folded-back portion 142, the wire is extended approximately horizontally toward the point which becomes the end point of the wire. The term "approximately horizontal" as used herein refers to a direction approximately in parallel with the surface (for example the surface of the electrode) to which the wire is ball bonded. In this case, the term "approximately horizontal" includes a range of angles within 30° of the axis of the wire with respect to the surface to which the wire is ball bonded. Also, a void 31 is preferably defined between the wire extended from the folded-back portion 142 of the wire and the peripheral portion of the ball portion 141. With this arrangement, sufficient bonding status can be ensured and good thermal dissipation can be obtained. A sealing resin may be provided in the void 31.

Figure 10:
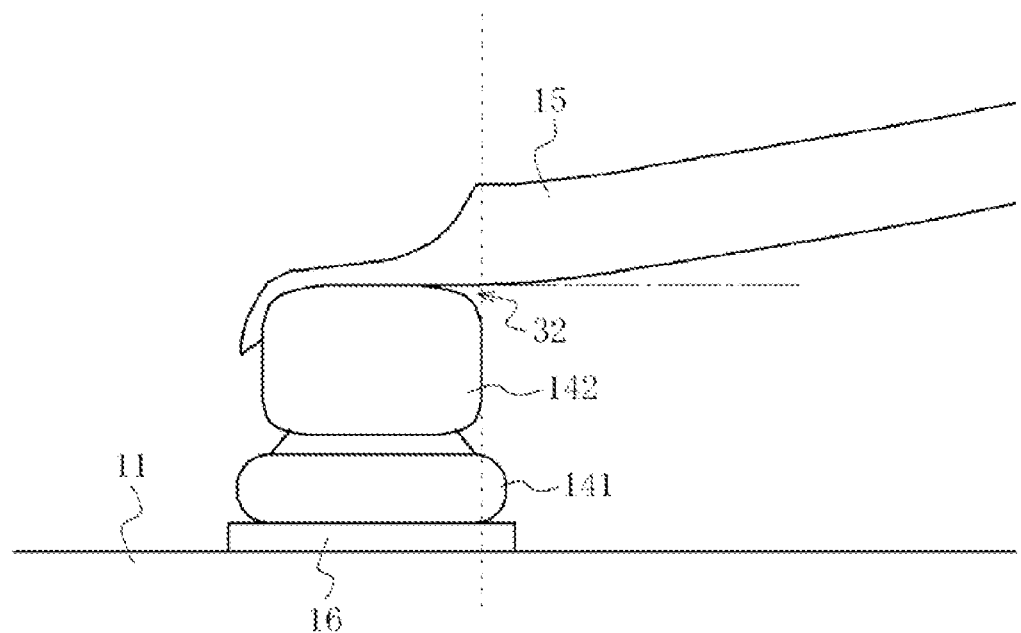
FIG. 10 is a cross-sectional view showing a detail of a second wire bonded on a folded-back portion of a first wire.

One end of the second wire is bonded to the third bonding point and the other end is bonded on the folded-back portion 142 of the first wire. In the case where the third bonding point is the electrode of the semiconductor element, a ball portion which is ball bonded to the third bonding point is preferably formed. FIG. 10 is a cross-sectional view showing a detail of a second wire 15 bonded on a folded-back portion 142 of a first wire. The first wire is extended from the folded-back portion 142 in a perpendicular direction to the plane of the figure. As described above, on the surface of an electrode of the light emitting element 16, a second wire 15 is formed through the ball portion 141 of the first wire, which allows the ball portion 141 at the lowermost layer to function as an under layer (because it is interposed between the metal member or surface of the electrode and the second wire) with respect to the surface of the metal member or the electrode 16 (particularly the surface of the electrode 16), so that defective bonding, damage to the light emitting elements, or the like can be efficiently prevented. The third bonding point is arranged at a location which is not on the straight line passing through the first bonding point and the second bonding point. That is, the second wire intersects with the extending direction of the first wire. The second wire 15 is bonded to the folded-back portion 142 of the first wire so as to cover the center point of the ball portion (so as to locate above the center point of the ball portion 141) of the first wire. Further, the tip end of the second wire 15 is extended along the folded-back portion and covers the folded-back portion at a side opposite the extending direction of the second wire (covers the folded-back portion 142 at least at a part of a side surface (the left-side side surface of the folded-back portion 142 in FIG. 10) at a side opposite to the third bonding point). In this case, as shown in FIG. 5, the top end of the second wire 15 is preferably bonded to cover at least a part of a side surface of the lower portion 142a of the folded-back portion 142. With this arrangement, the bonding strength in the vicinity of the folded-back portion can be increased. The tip end of the second wire may be bonded to cover the ball portion (at least a part of the ball portion 141). With this arrangement, the bonding strength in the vicinity of the folded-back portion can be further increased. Such an enhancement of the bonding strength between the first wire and the second wire achieved by the second wire covering at least a part of a side surface of the first wire 14 (preferably the side surface at the opposite side to the extending direction of the second wire) can also be applied in the bonding between the bonding portion (the bonding portion with the electrode 16) of the first wire on which a folded-back portion 142 is not formed and the second wire. That is, an embodiment in which at the bonding portion (joining point) of the second wire with the first wire, the bonding portion of the second wire covers not only the upper surface of the first wire but also at least a part of a side surface (preferably a side surface at the opposite side to the extending direction of the second wire) is included in the present invention either with or without having the folded-back portion 142. It is preferable that the second wire 15 defines a void 32 with the folded-back portion at the extending direction side of the second wire. Further, it is preferable that the second wire is preferably arranged approximately horizontal above the folded-back portion at the extending direction side of the second wire, and for example, as shown in FIG. 10, is disposed at an angle within 30° with respect to the surface of the electrode 16 as shown in FIG. 10. With this arrangement, stress applied on the wires can be reduced, so that disconnection or the like of the wires can be prevented.

The wire preferably has characteristics of good ohmic contact, good mechanical connection with the electrodes of the semiconductor element, and/or good electric conductivity and thermal conductivity. The thermal conductivity is preferably about 0.01 cal/(S) (cm$^2$) (° C./cm) or higher, and more preferably about 0.5 cal/(S) (cm$^2$) (° C./cm) or higher. In view of workability, the diameter of the wire is preferably about 10 μm to about 45 μm. Examples of the material for such wire include a metal such as gold, copper, platinum, and aluminum, and an alloy thereof. Among those, gold is preferable in view of joining reliability, stress relaxation after joining, or the like.

(Method of Manufacturing)

Figure 3A:
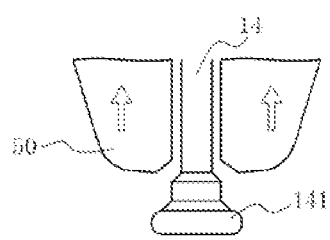
FIG. 3 is a schematic process view illustrating wire bonding as viewed from the Y-axis direction of FIG. 1.
Figure 3B:
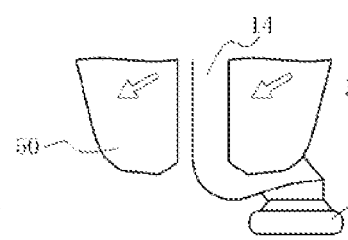
Figure 3C:
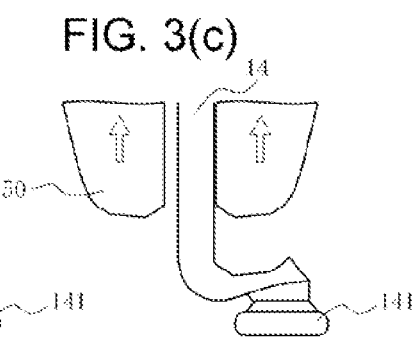
Figure 3D:
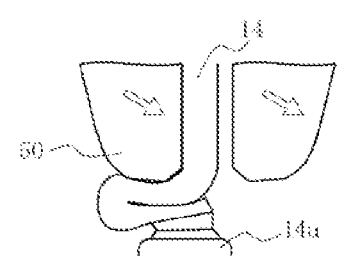
Figure 3E:
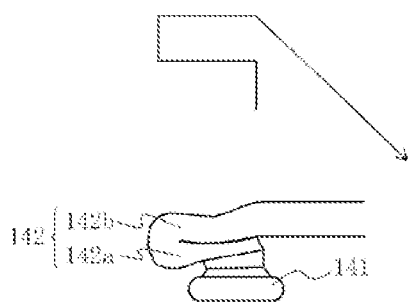
Figure 4A:
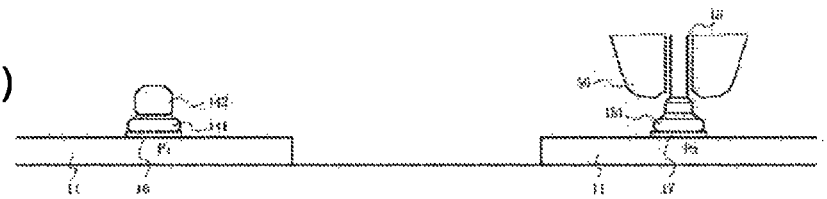
FIG. 4 is a schematic process view illustrating wire bonding as viewed from the X-axis direction of FIG. 1.
Figure 4B:
Figure 4C:
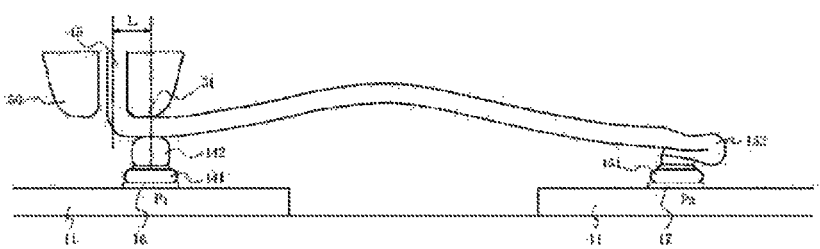
Figure 4D:
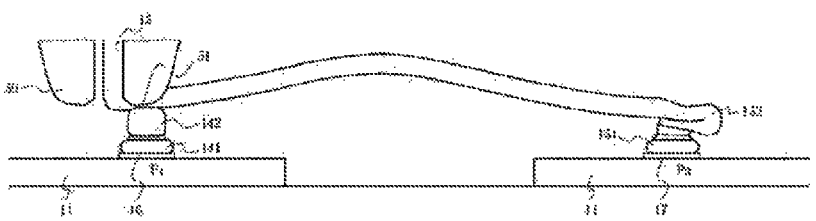
Figure 4E:
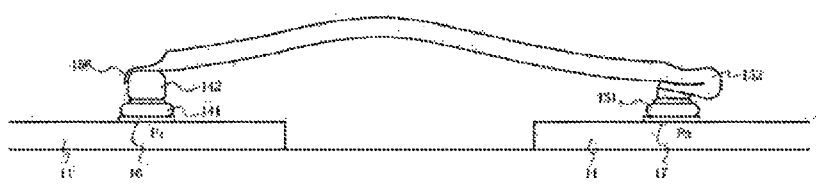

FIGS. 3(a) to 3(e) are schematic process views illustrating wire bonding in a semiconductor device according to an embodiment of the present invention, the schematic process views are seen from y-axis direction in FIG. 1. FIGS. 4(a) to 3(e) are schematic process views illustrating wire bonding in a semiconductor device according to an embodiment of the present invention, the schematic process views are seen from x-axis direction in FIG. 1. A method of manufacturing of a semiconductor device according to present embodiment includes a first step (FIGS. 3(a) to 3(e)) of ball bonding a first wire, and a second step (FIGS. 4(a) to 3(e)) of bonding a second wire onto a ball portion of the first wire.

Wire bonding method used in the wire connection in the present embodiment is not specifically limited, but generally, thermocompression wire bonding, ultrasonic thermocompression wire bonding, or the like, can be suitably employed.

Hereinafter, each step will be described in detail below.

(First Step)

A ball formed by melting a wire is press-bonded on an electrode of the semiconductor element which is the first bonding point. The wire extending from the press-bonded ball is further press-bonded on the press-bonded ball, then the wire is pulled in the direction of a second bonding point and connected to the second bonding point.

In this first step, firstly, a wire is passes through a jig of a capillary and the tip of the wire is melted by applying high temperature such as a spark to form a ball. The temperature is not specifically limited and can be adjusted according to the material, diameter, or the like of the wire to use. For example, this temperature may be 360° C. or lower. The size of the ball is not specifically limited, and generally, a diameter of about 2 to 20 times, preferably about 2 to 10 times of that of the wire can be employed.

Then, the ball is press-bonded on a metal member or a surface of the electrode and forms a ball portion. In the present invention, as described above, this press-bonded point is becomes the first bonding point. The load in this case can be appropriately adjusted by, for example, according to the spread diameter of the ball on the metal member or the electrode surface. At this time, press-bonding may be carried out while applying ultrasound. Next, the capillary is moved in the reverse direction to pull the first wire in the direction opposite to the direction to the point (that is a second bonding point) which is in the extending direction of the first wire. In this case, the "opposite direction" includes a range of about 150° to about 210° with respect to the direction of the second bonding point. It is preferable that the amount of the wire that is pulled out, that is, the moving distance of the capillary, is about 10 μm to about 100 μm.

The capillary is then appropriately lifted and moved directly over the ball portion, then lowered so that the capillary is press-bonded on the ball portion. With this, the first wire extended from the ball portion is folded back on the ball portion and pressed. As a result, a folded-back portion is formed on the ball portion and the surface of the folded-back portion and the surface of the wire in the vicinity of the folded-back portion can be made approximately flat. In this case, the press-bonding may be performed while applying ultrasonic waves, but the press-bonding is preferably performed without applying ultrasonic waves. This is because the wire may be squashed thin by the ultrasonic waves applied on it, which may cause a decrease in bonding reliability. Also, press-bonding a different portion of the wire onto the press-bonded ball enables to reduce the upward extension of the wire (occupying space). For example, the height of the wire can be set to up to about 1.0 to 5.0 times of the diameter of the wire from the bottom of the press-bonded ball, or from another point of view, to about 1 to 3 times of the height of the ball.

Next, the wire is pulled from directly above the press-bonded ball toward the second bonding point which is at a different location from the first bonding point, and bonded thereto. The bonding in this case can be carried out either with applying or without applying ultrasonic waves.

(Second Step)

After the first step, a second wire is bonded onto the folded-back portion 142 of the first wire. At this time, at least at a position opposite side (direction to the left in FIG. 4) from the extending direction of the second wire with respect to the center of the folded-back portion 142 of the first wire, an external force is applied on the second wire to squash and bond it to the folded-back portion. The second wire may be ball-bonded on a third bonding point and then pulled toward the first bonding point and bonded to the first bonding point.

In the second step, first, as in the first step, the tip of the wire passed through a jig such as a capillary is melted to form a ball.

Then, the ball is press-bonded on a metal member or a surface of the electrode to form a ball portion (FIG. 4(a)). In the present invention, as described above, this press-bonded point becomes the third bonding point. The load in this case can be appropriately adjusted by, for example, according to the spread diameter of the ball on the metal member or the electrode surface. At this time, press-bonding may be carried out while applying ultrasound. Also, as in the first step, a folded-back portion is formed over the ball portion of the second wire and a flat portion may be formed respectively on the surface of the folded-back portion and the surface of the wire in the vicinity of the folded-back portion (FIG. 4(b)).

Next, the capillary is moved from over the third bonding point to over the folded-back portion of the first wire. At this time, it is preferable that the center of the capillary (shown in alternate long and short dash line in FIG. 4(c)) is shifted from directly above the center (shown in dashed line in FIG. 4(c)) of the ball portion in an opposite direction with respect to the extending direction (the direction toward the third bonding point) of the second wire. In this case, the "opposite direction" includes a range of about 150° to about 210° with respect to the direction from the center of the ball portion of the first wire to the third bonding point. As described above, in the state of the capillary being positioned over the folded-back portion of the first wire, the distance L in the horizontal direction from the center of the ball portion of the first wire to the center of the capillary may be referred to as the "shift amount of the capillary". In this case, the shift amount of the capillary is preferably about 30 to 50 μm. Next, the capillary is lowered so that the capillary is pressed against the folded-back portion 142 of the first wire and the second wire is bonded. Pressing the capillary with its center being off-set as just described above enables the face portion 51 of the capillary 50 pushed against the folded-back portion arranged on the center of the ball portion of the first wire, so that excessive load can be prevented from being applied to a peripheral portion of the folded-back portion. Also, pressing the capillary 50 against the folded-back portion 142 of the first wire crushes the second wire interposed between the capillary and the folded-back portion of the first wire, so that the cross-sectional area of the second wire is reduced. Then, the second wire 15 is cut at the part with the reduced cross-sectional area. As described above, the capillary is pressed with its center being off-set in the opposite direction with respect to the extending direction of the second wire, so that the second wire is joined covering the center point (center) of the folded-back portion of the first wire and the cut surface 156 of the second wire is formed preferably at the opposite side of the extending direction of the second wire than the center of the ball portion of the first wire. Here, the term "cut surface" refers to the surface generated at the time of cutting to separate the wire 15 crushed by bonding and the wire 15 in the capillary. Also, the crushed tip (or the tip and in the vicinity thereof) of the second wire is joined in a state where it covers the folded-back portion of the first wire which is at the opposite side of the extending direction of the second wire (a state where it covers at least a part of a side surface which is a side surface of the folded-out portion 142 and is at the opposite side of the third bonding point), so that the joining strength of the second wire can be enhanced. The bonding load is preferably 40 to 80 μgf. With this, good joining state can be maintained. Also, at the time of pressing the capillary, with further lowering the capillary, the tip portion of the second wire may be pressed against the folded-back portion 142 of the first wire. With this arrangement, the joining strength of the wire can be further enhanced. Also, the squashed portion of the second wire may be joined to the ball portion (a side surface of the ball portion 141 at the opposite side of the third bonding point) at the opposite side of the extending direction of the second wire.

Figure 7:
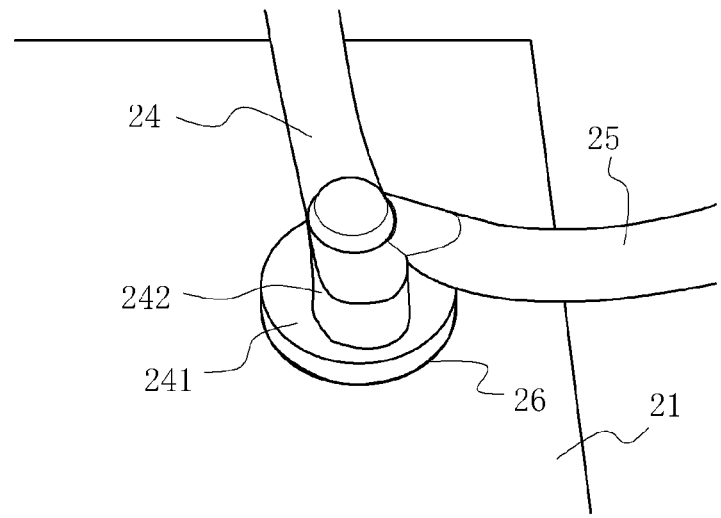
FIG. 7 is a schematic perspective view illustrating wire bonding of a semiconductor device according to a comparative example.

If the bonding is carried out with the center of the capillary positioning over the center point of the ball portion of the first wire, that is, with the shift amount of the capillary being 0, the center of the ball portion cannot be pressed by the capillary because the center of the capillary is the portion from where the wire material is supplied. Further, the pressure from the capillary is applied to the peripheral portion of the ball portion. This results in, for example, as shown in FIG. 7, a state where the wire is pressed against the peripheral portion of the ball portion. However, according to the present invention, such state can be avoided.

In the semiconductor device according to the present invention, a sequence of operations from forming a ball portion to joining to a second bonding point described above are performed two or more times between two different appropriate points. The operations are preferably performed three times, four times or more times according to the number of the semiconductor elements that are mounted, the type of electrodes of the semiconductor elements, and the type of the connection of the semiconductor elements. From a different point of view, the first bonding point and/or the second bonding point is preferably provided three or more in total for each semiconductor element, and more preferably, two or more of each of the bonding points are provided for each semiconductor element. In this case, on the ball portion of a wire at one bonding point, two or more wires respectively extended from other bonding points may be connected. In the semiconductor device according to the present invention, the angle between the extending direction of the first wire and the extending direction of the second wire can be appropriately adjusted according to the size of the semiconductor device and the arrangement of the electrodes and metal members of the semiconductor element. Also, as shown in FIG. 6, the semiconductor device may have a portion where two or more wires are connected in a straight line.

Examples of a semiconductor device according to the present invention will be described in detail below with reference to Figures.

EXAMPLE

Figure 6:
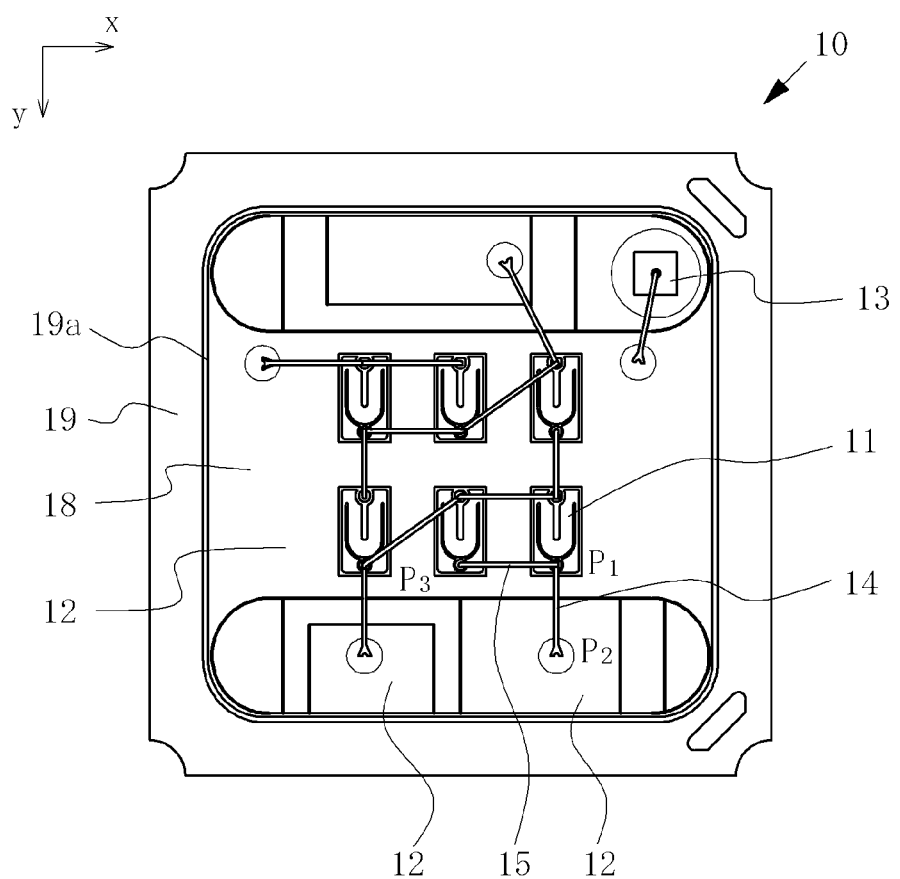
FIG. 6 is a schematic plan view showing a variant example of a semiconductor device according to an embodiment of the present invention.

FIG. 6 is a schematic plan view showing a semiconductor device according to the present example. FIGS. 3(*a*) to 3(*e*) and FIGS. 4(*a*) to 4(*e*) are respectively schematic cross-sectional process views illustrating joining of a wire of a semiconductor device according to the present example. As shown in FIG. 6, the semiconductor device 10 of the present example is constituted with a semiconductor element 11, a planar metal member 12, wires electrically connecting between the semiconductor element 11 and the metal member 12 and between the semiconductor elements 11 respectively, and an encapsulating resin 19 encapsulating all the members in a single body. In the semiconductor device 10, a protective element 13 electrically connected to the metal member 12 is further mounted.

Each metal member 12 is a planar body made of an aluminum alloy. A metal member 12 has a region for mounting a semiconductor element 11 and a region extending in a single direction from the mounting region of the semiconductor element. The molded body 19 is formed in a single body with a part of the metal member 12 being inserted, in an approximately cuboid shape (length of 3.5 mm, width of 3.5 mm, and height of 0.85 mm). The molded body defines, near the center thereof, a window portion 19*a* having an approximately quadrangular shape with rounded corners (length of 2.9 mm and width of 2.9 mm). In the window portion 19*a*, a part of the metal member 12 is exposed and a semiconductor element 11 is mounted on the exposed metal members 12. Further, in the window portion 19*a*, a sealing resin 18 having light transmissive property is embedded.

The semiconductor element 11 has two electrodes formed on the surface thereof, and each of the electrodes is electrically connected to the metal member 12 or other electrodes, respectively, by a wire. The wires are joined to a metal member surface or an electrode surface by wire bonding. On the first bonding portion (first bonding point) which is on the electrode of each semiconductor element 11, a ball formed by melting a wire is press-bonded on the surface of the electrode 16 (ball portion 141), the wire extended (stretched) from the press-bonded ball is further folded back on the press-bonded ball (folded-back portion 142), and extended (stretched) in a direction of the metal member 12 which is the second bonding point, and joined on the surface of the metal member 12 (wedge-bonded portion). That is, at the first bonding point $p_1$, at a side opposite to the second bonding point, a loop shape is formed by the wire, and the surface and/or top portion of the folded-back portion is squashed together with a part of the wire and has a relatively flat shape.

The joining of the first wire 14 is carried out such that, firstly, the wire is passed through a capillary and the tip of the wire is melted by applying high temperature of a spark to form a ball. Then, the ball is pressed against the surface of the electrode and joined to it (FIG. 3(*a*)). This press-bonded point becomes a first bonding point. For the wire, one with a diameter of 25 μm is used, and the diameter of the ball 141 is 70 μm or greater. Next, as indicated by the arrow in FIG. 3(*a*), the capillary 50 is lifted from the press-bonded point to pull the wire out, then in order to stretch the wire in a direction opposite to the second bonding point, the capillary is moved in the opposite direction (FIG. 3(*b*)).

Then, the capillary 50 is lifted (FIG. 3(*c*)), moved directly above the ball and the wire is fed out, and the capillary is pressed against on the ball (FIG. 3(*d*)). With this, a different part of the wire (first wire 14) which is extended from (or continuous to) the press-bonded ball is folded back on the ball portion, and the surface of the folded-back portion and the wire in the vicinity thereof become approximately flat (FIG. 3(*e*)). Next, as indicated by the arrow in FIG. 3(*e*), the capillary (not shown) is lifted to fed out the wire and is moved horizontally in the direction opposite from the second bonding point, then, the capillary is lifted again to fed out the wire and moved horizontally, passing directly above the press-bonded ball to the second bonding point, then the capillary is lowered while pulling out the wire and joins the wire to the second bonding point. With this, the first wire 14 which bridges between the first bonding point and the second bonding point is formed.

In the semiconductor device, on the first bonding point $P_1$ of the electrode 16, a second wire 15 which electrically connects the electrode 16 and another electrode 17 (third bonding point $P_3$) is arranged. The second wire 15 intersects with the extending direction of the first wire 14. In the joining of the second wire 15, as in the step of joining of the first wire 14, first, the tip of the wire passed through a jig such as a capillary is melted and a ball is formed.

Then, the ball is pressed against a metal member or a surface of the electrode to form a ball portion (FIG. 4(a)). This press-bonded point becomes a third bonding point. Also as in the first step, it may be such that a folded-back portion is formed over the ball portion of the second wire and a flat portion is formed respectively on the surface of the folded-back portion and the surface of the wire in the vicinity of the folded-back portion (FIG. 4(b)).

Next, the capillary is moved from over the third bonding point to over the folded-back portion of the first wire. At this time, the center of the capillary (shown in alternate long and short dash line in FIG. 4(c)) is off-set from directly above the center point (shown in dashed line in FIG. 4(c)) of the ball portion to a position in an opposite direction from the extending direction (the direction toward the third bonding point) of the second wire. Next, the capillary is lowered so that the capillary is pressed against the folded-back portion of the first wire and the second wire is bonded (FIG. 4(d)). Pressing the capillary against the folded-back portion of the first wire crushes the second wire interposed between the capillary and the folded-back portion of the first wire, so that the cross-sectional area of the second wire is reduced. Then, the second wire is cut at the part with the reduced cross-sectional area (FIG. 4(e)). In the present example, the joining of the second wire 15 on the ball portion of the first wire 14 is carried out with the shift amount of the capillary being 40 μm and the bonding load being 40 gf.

In the semiconductor device 10 with such a configuration, the second wire 15 is joined on the folded-back portion 142 of the first wire 14, and further, the tip of the second wire 15 covers the folded-back portion 142 at the opposite side from the extending direction of the second wire. In the semiconductor device 10 of the present invention, the joining state of the wires can be preferably maintained.

COMPARATIVE EXAMPLE

FIG. 7 is a partially enlarged schematic cross sectional view of a semiconductor device according to a comparative example. A semiconductor device similar to that of Example 1 is formed by using substantially the same method of manufacturing as in Example 1, except that when the second wire 25 is bonded on the first wire 24, the center of the capillary is at a position above the center point of the ball portion 241 of the first wire 24, that is, bonding is carried out with the amount of shift being 0. As a result, the second wire 25 is joined to a peripheral portion of the folded-back portion of the first wire at a side in the extending direction of the second wire. The semiconductor devices of Comparative Example are, compared to the semiconductor devices of Example 1, more prone to breakage of wire in reliability test.

Figure 8:
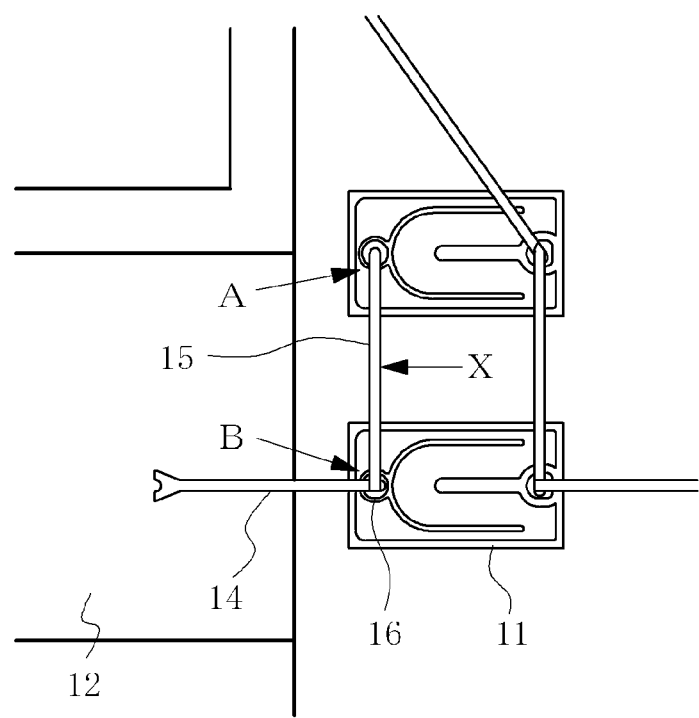
FIG. 8 is a plan view illustrating a strength test of a wire.

Each 10 units of the semiconductor device similar to that of Example and Comparative Example are made and strength test is conducted by pulling the second wire of each device and the load (gf) and the location at the time of breaking the wire are examined. The results are shown in Table 1. In Table 1, the locations indicated by symbols A and B respectively refer to breakages occurred at A and B shown in FIG. 8. Explanation of each symbol is as below:
A: near the folded-back portion of second wire
B: near the tip of second wire
In FIG. 8, the location shown by X indicates the location where the wire is pulled in the strength test.

TABLE 1

|  | Example | | Comparative Example | |
| --- | --- | --- | --- | --- |
|  | strength (gf) | location of breakage | strength (gf) | location of breakage |
| 1 | 9.258 | A | 6.247 | B |
| 2 | 8.268 | A | 8.102 | B |
| 3 | 9.027 | A | 5.356 | B |
| 4 | 9.416 | A | 8.621 | A |
| 5 | 9.378 | A | 7.613 | B |
| 6 | 9.358 | A | 8.684 | B |
| 7 | 8.596 | A | 7.219 | B |
| 8 | 9.035 | A | 8.644 | B |
| 9 | 9.116 | A | 7.326 | B |
| 10 | 8.997 | A | 6.798 | B |
| average | 9.044 | | 7.461 | |

The average result of the strength test on Example was about 9.04 gf. In the semiconductor devices of Example, all the 10 units did not have breakage near the tip (B) of the second wire and had breakage near the folded-back portion (A) of the second wire. In contrast, the average result of the strength test on Comparative Example was about 7.46 gf. Also, in the semiconductor devices of Comparative Example, 9 units out of the 10 units have breakage near the tip (B) of the second wire. This result enables to confirm that, because the semiconductor devices of Example did not have breakage near the tip (B) of the second wire, the first wire and the second wire has high joining strength. Further, the semiconductor devices of Example were confirmed to have higher joining strength than the semiconductor devices of Comparative Example.

INDUSTRIAL APPLICABILITY

The semiconductor device of the present invention, equipped with the semiconductor element, can be used not only in lighting devices used in image readers such as facsimile machines, copy machines, and portable scanners, but also in various other lighting devices such as illumination light sources, LED displays, backlight sources for portable telephones etc., signaling devices, lighting switches, automotive brake lamps, various kinds of sensors, various kinds of indicators, and so on. The present invention can be utilized widely not only in semiconductor devices but also for wire bonding in various semiconductor devices such as IC and memory cells.

| DENOTATION OF REFERENCE NUMERALS | |
| --- | --- |
| 10 | semiconductor device |
| 11, 21 | semiconductor element |
| 12 | metal member |
| 13 | protective element |

-continued

| DENOTATION OF REFERENCE NUMERALS | |
|---|---|
| 14, 24 | first wire |
| 141, 241 | ball portion of first wire |
| 142, 242 | folded-back portion of first wire |
| 142a | lower part of folded-back portion |
| 142b | upper part of folded-back portion |
| 144 | wedge-bonded portion |
| 15, 25 | second wire |
| 151 | ball portion of first wire |
| 152 | folded-back portion of first wire |
| 16, 17, 26 | electrode |
| 18 | sealing resin |
| 19 | molded body |
| 19a | window portion |
| 50 | capillary |
| 51 | face portion |

The invention claimed is:

1. A semiconductor device comprising:
a first wire having one end bonded to an electrode and another end bonded to a second bonding point at a portion other than the electrode; and
a second wire having one end bonded on the first wire over the electrode and another end bonded to a third portion which is a portion different than the electrode, a bonding portion at the one end of the second wire covering at least a part of the upper surface and a part of a side surface of the first wire that extends from the second bonding point to the electrode,
wherein a direction along which the second wire extends from the third portion to the bonding portion intersects a direction along which the first wire extends from the second bonding point to the electrode,
wherein the first wire has a folded-back portion in which the first wire is extended from the end bonded to the electrode in a direction opposite to the second bonding point and then folded back toward the second bonding point, and
wherein the one end of the second wire is bonded on the folded-back portion to cover at least a part of the side surface of the folded-back portion opposite from the third portion.

2. The semiconductor device according to claim 1, wherein the one end of the first wire is formed in a ball portion bonded on the electrode, such that in the folded-back portion the first wire is extended from the ball portion in a direction opposite to the second bonding point and then folded back on the ball portion.

3. The semiconductor device according to claim 1, wherein the folded portion has a lower folded-back portion extending from over the ball portion in a direction opposite to the second bonding point, and an upper folded-back portion arranged on the lower folded-back portion and folded back on the ball portion, and
wherein the one end of the second wire covers at least a part of a side surface of the lower folded-back portion at a side opposite to the second bonding portion.

4. The semiconductor device according to claim 2, wherein the one end of the second wire covers at least a part of the ball portion.

5. The semiconductor device according to claim 3, wherein the one end of the second wire covers at least a part of the ball portion.

6. The semiconductor device according to claim 2, wherein the second wire is approximately horizontally arranged on the folded-back portion.

7. The semiconductor device according to claim 3, wherein the second wire is approximately horizontally arranged on the folded-back portion.

8. The semiconductor device according to claim 4, wherein the second wire is approximately horizontally arranged on the folded-back portion.

9. The semiconductor device according to claim 5, wherein the second wire is approximately horizontally arranged on the folded-back portion.

10. A method of manufacturing a semiconductor device, comprising:
bonding one end of the first wire to form a ball portion on an electrode, and bonding another end of the first wire to a second bonding point which is not on the electrode, wherein the first wire is extended from the ball portion in a direction different to the second bonding point and on the ball portion the first wire is bonded to the first wire extended in the different direction so as to form a folded-back portion; and
bonding one end of a second wire on the folded-back portion and bonding another end of the second wire to a third bonding point which is not on the electrode, wherein the second wire is deformed at a side opposite from the third bonding point with respect to a center of the folded-back portion and an end portion of the second wire covers at least a part of a side of the folded-back portion opposite from the third bonding point, and wherein a direction along which the second wire extends from the third bonding point to the folded-back portion intersects a direction along which the first wire extends from the second bonding point to the electrode.

11. The method of manufacturing the semiconductor device according to claim 10, wherein in the bonding process of the first wire, the folded-back portion is formed by forming a lower folded portion extending from over the ball portion in a opposite direction to the third bonding point and forming an upper folded portion bonded on the lower bonding portion and extended on the ball portion from the opposite direction, and
wherein in the bonding process of the second wire, an end portion of the second wire covers at least a part of a side surface of the lower folded portion at an opposite side from the second bonding point by the deformation.

12. The method of manufacturing the semiconductor device according to claim 10, wherein by the deformation, the second wire is bonded to at least a part of the ball portion.

13. The method of manufacturing the semiconductor device according to claim 11, wherein by the deformation, the second wire is bonded to at least a part of the ball portion.

14. The method of manufacturing the semiconductor device according to claim 10, wherein the second wire is approximately horizontally bonded on the folded portion.

15. The method of manufacturing the semiconductor device according to claim 11, wherein the second wire is approximately horizontally bonded on the folded portion.

16. The method of manufacturing the semiconductor device according to claim 12, wherein the second wire is approximately horizontally bonded on the folded portion.

17. The method of manufacturing the semiconductor device according to claim 13, wherein the second wire is approximately horizontally bonded on the folded portion.

18. The semiconductor device according to claim 2, wherein the bonding portion at the one end of the second wire covers a part of a side surface at an opposite side of the third bonding portion of the first wire.

* * * * *